(12) United States Patent
Randolph et al.

(10) Patent No.: US 9,977,446 B2
(45) Date of Patent: May 22, 2018

(54) INVERTING AMPLIFIER RECEIVING NEGATIVE FEEDBACK VOLTAGE IN VOLTAGE REGULATOR

(71) Applicant: Linear Technology Corporation, Milpitas, CA (US)

(72) Inventors: Hezekiel D. Randolph, Sunnyvale, CA (US); Min Chen, Fremont, CA (US); Niranjan G. Kumar, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days. days.

(21) Appl. No.: 15/593,266

(22) Filed: May 11, 2017

(65) Prior Publication Data

US 2017/0336817 A1    Nov. 23, 2017

Related U.S. Application Data

(60) Provisional application No. 62/338,422, filed on May 18, 2016.

(51) Int. Cl.
*G06G 7/12* (2006.01)
*G05F 1/575* (2006.01)
*H03F 3/45* (2006.01)
*H03K 5/24* (2006.01)

(52) U.S. Cl.
CPC ........... *G05F 1/575* (2013.01); *H03F 3/4521* (2013.01); *H03F 3/45273* (2013.01); *H03K 5/24* (2013.01); *H03F 2200/471* (2013.01)

(58) Field of Classification Search
CPC ...... H03G 1/0088; H03G 1/007; H03G 3/001; H03F 3/45475; H03F 1/342

USPC ........... 327/560–563; 330/252–253, 85, 282
See application file for complete search history.

(56) References Cited

U.S. PATENT DOCUMENTS

| | | | | |
|---|---|---|---|---|
| 6,750,712 B1* | 6/2004 | Hoang | ................... | H03F 1/3211 330/252 |
| 7,193,466 B2* | 3/2007 | Kim | ..................... | H03F 3/45188 330/253 |
| 2005/0046483 A1* | 3/2005 | Kim | ......................... | H03F 1/34 330/311 |
| 2012/0286869 A1* | 11/2012 | Kim | ..................... | H03F 3/45179 330/253 |
| 2016/0322965 A1* | 11/2016 | Elran | ................... | H03K 17/687 |

* cited by examiner

*Primary Examiner* — Quan Tra
(74) *Attorney, Agent, or Firm* — Patent Law Group LLP; Brian D. Ogonowsky

(57) ABSTRACT

In the example of a voltage regulator outputting a negative voltage, its feedback voltage will also be negative. The feedback voltage is typically created using a resistor divider. A controller IC is powered by only a positive voltage and receives the negative feedback voltage at a high impedance input of an inverting amplifier. Therefore, the inverting amplifier does not load the resistor divider, resulting in an accurate regulated output voltage. The inverting amplifier converts the negative feedback voltage to a positive feedback voltage for further processing by the controller IC. An error amplifier and a power good monitor receive both the original feedback voltage and the inverted feedback voltage and use whichever feedback voltage is the more positive one. Therefore, the controller IC may be used in voltage regulators that generate either negative or positive output voltages.

13 Claims, 4 Drawing Sheets

INVERTING AMPLIFIER RECEIVING NEGATIVE FEEDBACK VOLTAGE IN VOLTAGE REGULATOR

CROSS-REFERENCE TO RELATED APPLICATIONS

This application is based on and claims priority from U.S. provisional patent application Ser. No. 62/338,422, filed on May 18, 2016, by Hezekiel Randolph et al., assigned to the present assignee and incorporated herein by reference.

FIELD OF THE INVENTION

This invention relates to voltage regulators that can generate a negative output voltage using a positive input voltage and, in particular, to an inverting amplifier in the regulator that receives a negative feedback voltage and converts the negative feedback voltage to a positive feedback voltage for processing by the regulator.

BACKGROUND

Controller integrated circuits (IC) for voltage regulators receive a voltage feedback signal corresponding to the output voltage of the regulator and, based on the feedback signal, control the switching of a switching transistor to regulate the output voltage to be a target voltage. The user typically selects values in a simple resistor divider that divides the output voltage so that, when the target output voltage is generated, the node of the divider produces a feedback voltage equal to a fixed reference voltage of, for example, 1 volt. The feedback voltage is connected to one input of an error amplifier, and the other input of the error amplifier receives the fixed reference voltage. The regulator maintains the output voltage such that the divided voltage is equal to the reference voltage.

The switch is typically connected to an output circuit (external to the controller IC) comprising various configurations of an inductor, a smoothing output capacitor, and a diode (or synchronous rectifier) to generate the output voltage. The specific output circuit configuration determines whether the regulator is a buck regulator, a boost regulator, a buck-boost regulator, a positive-to-negative voltage regulator, or other type of regulator. The output circuit is typically designed by the user for a particular application, and the user can control different types of regulators using the same model controller IC.

Some applications may require the voltage regulator to generate a negative output voltage using a positive input voltage, where the operating voltage for all components in the controller IC is a positive voltage. Since the negative output voltage will generate a negative feedback voltage (a divided output voltage), there must be some circuitry in the controller IC that converts the negative feedback voltage to a positive feedback voltage in order for the downstream circuitry to process the feedback voltage (since the downstream components are powered by only a positive operating voltage). Such a voltage regulator outputs a negative voltage (and feedback voltage) with a ripple that is phase-inverted with the control signal for the switching transistor, since reducing the switch duty cycle causes a ramp-up in output voltage. For proper processing of the feedback voltage, the ripple phase must be inverted.

A level shifter that converts a negative feedback voltage to a positive feedback voltage can be used, but such a level shifter has various drawbacks, such as the ability to only accurately process a narrow range of signals. Further, the feedback ripple voltage still needs to be phase-inverted by other circuitry. Such drawbacks require more complicated downstream circuitry to compensate for the reduced range of signals and the phase inversion.

A conventional inverting amplifier can also be used to convert a negative feedback voltage to a positive feedback voltage, inherently phase-inverting the feedback voltage. Such a conventional inverting amplifier can process a wide range of input signals. However, such conventional inverting amplifiers have a low input impedance, which places a load on the resistor divider used to create the feedback signal. Such a load thus distorts the magnitude of the feedback signal which, in turn, distorts the output voltage.

FIG. 1 is an example of a conventional inverting amplifier. If we assume the feedback voltage VFB is a negative voltage, the differential amplifier 10 uses feedback through the resistor R2 to cause both of its inputs to be at ground voltage. Since the inverting input terminal of the amplifier 10 is made to be at ground voltage, and assuming the resistors R1 and R2 have the same value, the inverted output voltage VFB_INV must be a positive voltage having an absolute value equal to VFB. Since the resistor R1 is between the feedback voltage VFB and ground voltage, the resistor R1 forms a load at the node of a resistor divider (not shown) used to generate the feedback voltage VFB. Since the user selects the resistor divider values to generate a target feedback voltage, such as 1 volt, when the output voltage is at the target voltage, the added load of the resistor R1 on the resistor divider will distort the feedback voltage magnitude and thereby distort the output voltage. Further, the absolute values of resistors in such an inverting amplifier vary somewhat from lot to lot, so the true loading of the resistor divider in the feedback network would be unpredictable and vary from lot to lot.

What is needed is an inverting amplifier that can receive a negative feedback voltage in a voltage regulator and convert the negative feedback voltage to a positive feedback voltage while not adding any significant load to the resistor divider feedback circuit.

SUMMARY

In one embodiment, a voltage regulator is powered by only a positive voltage supply and configured to generate a negative voltage. A controller IC is used in the voltage regulator, where the same model controller IC may be used in a variety of different types of voltage regulators, such as regulators that can generate positive or negative voltages.

When a negative output voltage is generated by the regulator, the divided feedback voltage will also be negative. A novel inverting amplifier, in the controller IC, receives the negative feedback voltage and converts the negative feedback voltage to a positive feedback voltage of the same absolute magnitude. The inverting amplifier has a very high input impedance, since its input terminal is connected to a gate of a MOSFET. Therefore, the inverting amplifier does not affect the resistor divider used to generate the feedback voltage, resulting in a more accurate output voltage. The positive feedback voltage is then applied to an error amplifier for setting the duty cycle of a switching transistor to achieve the target output voltage.

If the original feedback signal is already positive, the inverting amplifier does not invert the feedback signal (the inverting amplifier cannot generate a negative voltage), and the output of the inverting amplifier is ignored by the downstream circuitry. Thus, if the original feedback voltage is positive, that feedback signal is applied to the downstream circuitry and the inverting amplifier is essentially bypassed.

The error amplifier in the controller IC is also novel. The same controller IC can be used in voltage regulators that generate either positive or negative output voltages, where the error amplifier receives both the original feedback signal (positive or negative) and the inverted feedback signal (only inverted if the original feedback voltage was negative) and outputs the correct error signal for adjusting the switching duty cycle to achieve the target output voltage.

Therefore, the controller IC can be used in a wide variety of voltage regulator applications.

In some voltage regulators, a power good signal is generated to convey to other circuits that the output voltage is at the proper level. This is done by detecting the level of the feedback voltage. A novel power good monitor circuit is also disclosed that receives both the original feedback signal and the inverted feedback signal to determine whether to generate the power good signal.

Other embodiments are described.

BRIEF DESCRIPTIONS OF DRAWINGS

Elements that are the same or equivalent in the various figures are labeled with the same numeral.

DETAILED DESCRIPTION

The inverting amplifier of the present invention converts negative feedback pin voltages to an equivalent positive feedback voltage. The inverting amplifier has a high input impedance (a gate of a MOSFET). The inverting amplifier permits downstream feedback loop circuits, such error amplifiers and power good monitors, to process a wide range of analog positive feedback voltages and to be operated using only a positive supply voltage, while the high input impedance of the inverting amplifier does not affect the accuracy of the feedback voltage. The phase of the feedback voltage is inverted by the inverting amplifier.

The inverting amplifier is first described followed by a description of a voltage regulator that uses the inverting amplifier in a controller IC. The inverting amplifier may have uses in other than voltage regulators.

Figure 1:
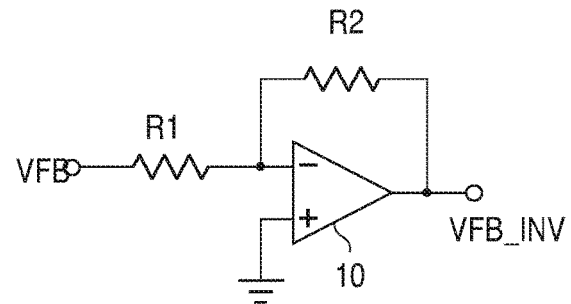
FIG. 1 illustrates a conventional inverting amplifier.
Figure 2:
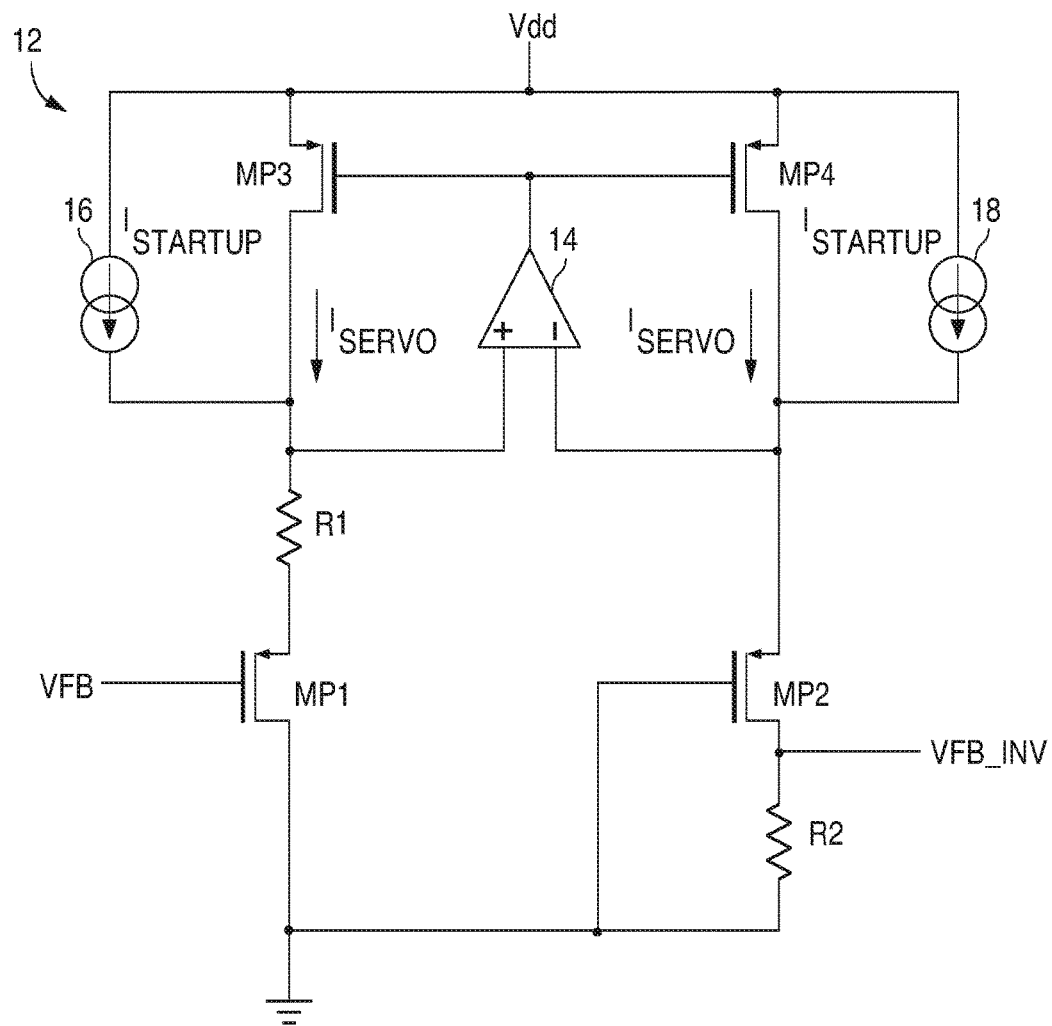
FIG. 2 illustrates an inverting amplifier in a controller IC in accordance with one embodiment of the present invention.

FIG. 2 is a high level diagram of the novel inverting amplifier 12 receiving a feedback voltage VFB from a voltage regulator. It will be assumed that the feedback voltage is a negative voltage. A differential amplifier 14 has its power supply terminals coupled to a positive supply voltage and ground.

Initially, the circuit is powered up from an off state. A small startup current ($I_{STARTUP}$), generated by identical current sources 16 and 18, is needed to initially begin operation of the inverting amplifier 12. The startup current flows through the equal value resistors R1 and R2 and the matched p-channel MOSFETs MP1 and MP2. Therefore, the initial inverted feedback voltage VFB_INV is the voltage drop across resistor R2, which is $I_{STARTUP}*R2$.

Assuming the feedback voltage VFB is negative, the VFB will turn on the MOSFET MP1. The voltage at the source of the MOSFET MP1 will be VFB plus the MOSFET MP1 gate-to-source voltage Vgs. The resulting voltage at the non-inverting terminal of the differential amplifier 14 will thus be $(VFB+Vgs)+I_{STARTUP}*R1$.

The gate of the MOSFET MP2 is coupled to ground (or other reference voltage) so its source is at the gate-to-source voltage Vgs. The source of the MOSFET MP2 is coupled to the inverting input of the differential amplifier 14, so as the VFB decreases below $-I_{STARTUP}*R1$, the output of the differential amplifier 14 will be a negative voltage and turn on the p-channel MOSFETs MP3 and MP4. The equal currents ($I_{SERVO}$) conducted by MOSFETs MP3 and MP4 are greater than the startup current and thus dominate the operation soon after power is applied to the circuit.

The inverted (positive) feedback voltage VFB_INV tracks the original negative feedback voltage VFB as follows. After VFB goes below $-I_{STARTUP}*R1$, VFB_INV=|VFB|. During steady state operation, the feedback paths in FIG. 2 cause the inverting and non-inverting inputs into the differential amplifier 14 to be equal to Vgs. The inverted feedback voltage VFB_INV equals $(I_{SERVO}+I_{STARTUP})*R2$.

Since the feedback loop causes both inputs into the differential amplifier 14 to be Vgs, then $VFB+Vgs+(I_{SERVO}+I_{STARTUP}*R1)=Vgs$ (assuming the reference voltage is zero volts). Since the Vgs on both sides of the equation cancel out, $VFB=-(I_{SERVO}+I_{STARTUP})*R1$). Since Vgs exists on both ends of the resistor R1, the voltage across the resistor R1 is equal to VFB. As a result, since $I_{SERVO}$ and $+I_{STARTUP}$ are the same on both legs of the circuit and the resistors R1 and R2 are the same value, VFB=-VFB_INV.

Since the resistor R2 is connected in series with the MOSFET MP2, the source to drain voltage of the MOSFET MP2 precisely matches the source to drain voltage of the MOSFET MP1, so that both MOSFETs have the same operating conditions for high accuracy.

Related equations are as follows:

$$VFB+Vgs+(I_{SERVO}+I_{STARTUP})*R1=Vgs.$$

$$I_{SERVO}=(-VFB/R1)-I_{STARTUP}, \text{or 0,whichever is higher.}$$

$$VFB\_INV=-VFB \text{ or } (I_{STARTUP}*R2), \text{whichever is higher.}$$

Importantly, the input impedance of the inverting amplifier 12 is very high since VFB is coupled to the gate of the MOSFET MP1. Thus, there is no load on any voltage divider used to generate VFB, resulting in a more accurate feedback voltage.

Figure 3:
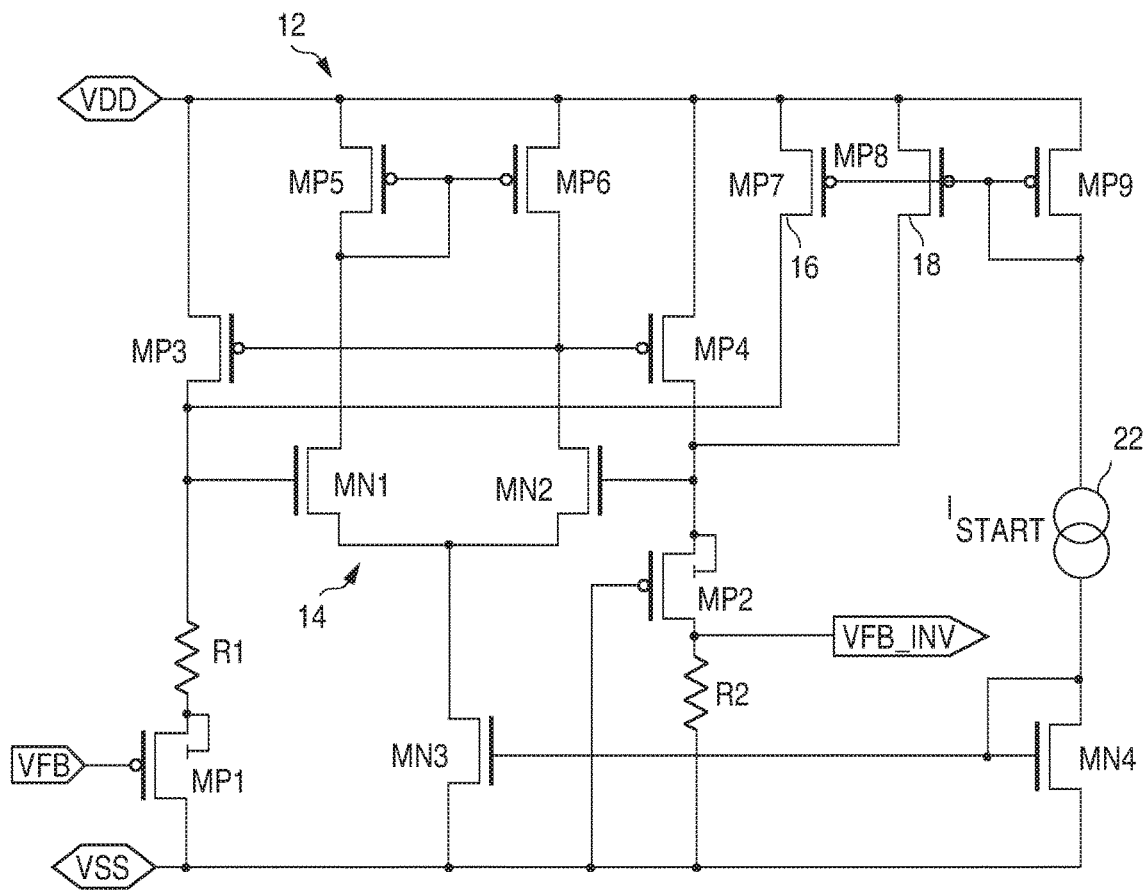
FIG. 3 illustrates the inverting amplifier of FIG. 2 in more detail.

FIG. 3 illustrates the circuit of FIG. 2 on a transistor level. The MOSFETs MN1, MN2, MP5, and MP6 make up the differential amplifier 14. The startup up current is generated by the MOSFETs MP7 and MP8 being connected in a current mirror, with the MOSFETs MP9 and MN4 and the current source 22 generating $I_{START}$.

Although the body terminals of the MOSFETs MP1 and MP2 are shown tied to their sources, the body terminals may be tied to other voltages, such as to a voltage higher than the source voltage to increase the threshold voltages of the MOSFETs by the same amount.

Figure 4:
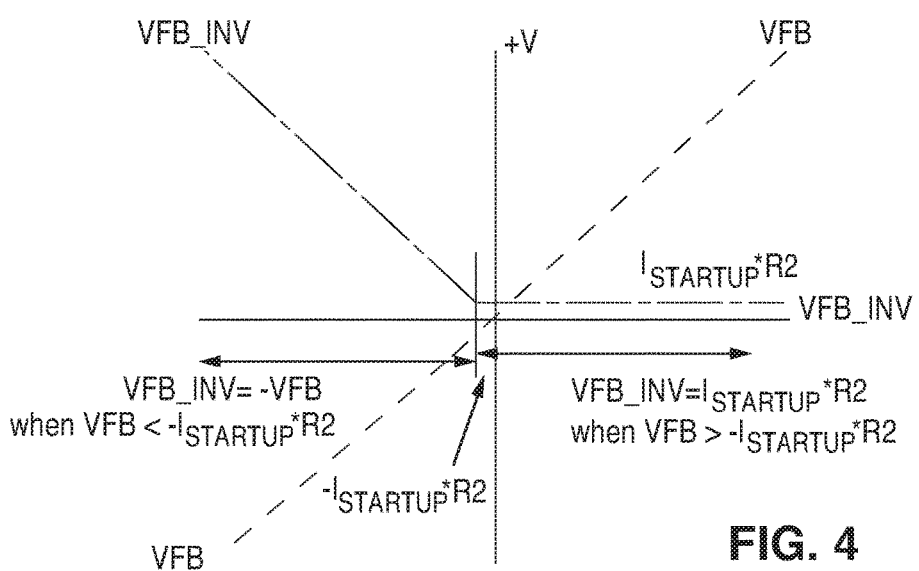
FIG. 4 illustrates the transfer characteristics of the inverting amplifier of FIG. 3, showing how an original negative feedback voltage produces a positive feedback voltage of equal magnitude. If the original feedback voltage is positive, the output of the inverting amplifier is ignored.

FIG. 4 illustrates the transfer characteristics of the inverting amplifier 12 of FIG. 3, showing how an original negative feedback voltage VFB produces a positive feedback voltage VFB_INV of equal magnitude when VFB<−$I_{STARTUP}$*R2. If the original feedback voltage VFB is positive, the output of the inverting amplifier 12 is not the inverse of VFB, but is $I_{STARTUP}$*R2, and is ignored by the downstream circuitry.

Figure 5:
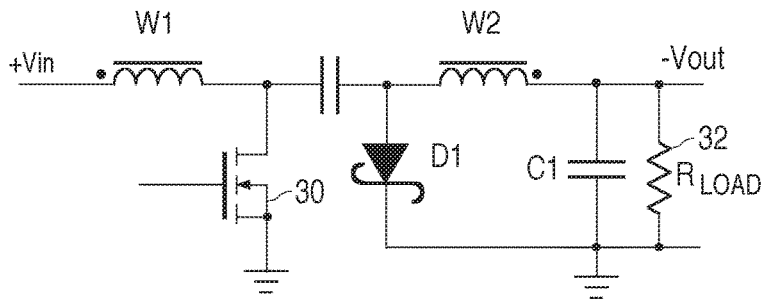
FIG. 5 illustrates a conventional output circuit for a positive-to-negative Cuk regulator that may be used with the controller IC.
Figure 7:
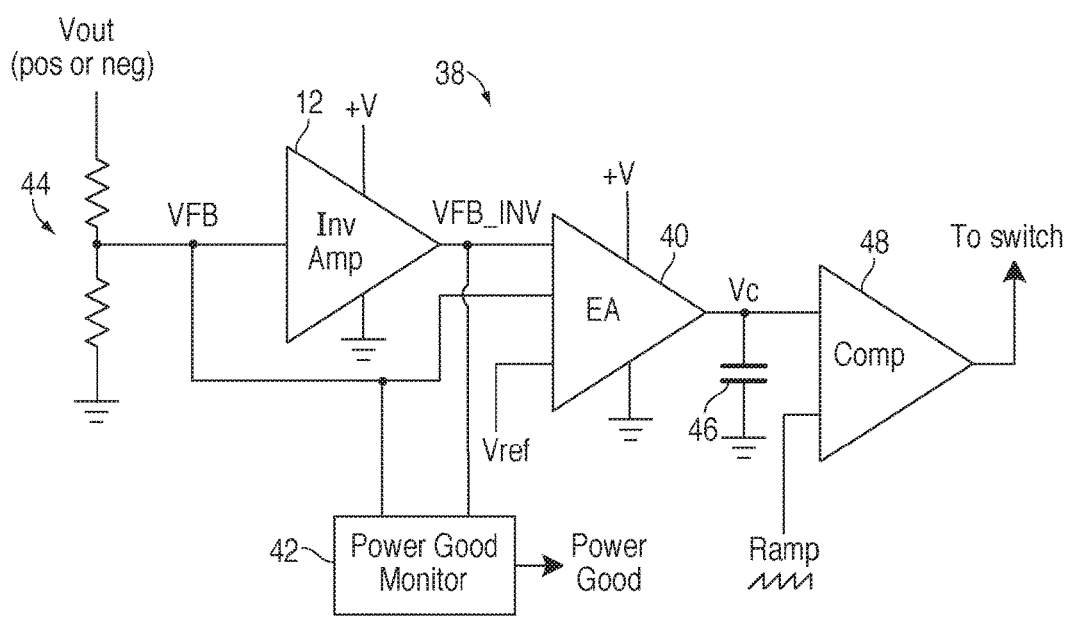
FIG. 7 illustrates a voltage regulator incorporating the inventive inverting amplifier, error amplifier, and power good monitor that may be used with a variety of output circuits, including the output circuits of FIGS. 5 and 6.

FIG. 5 illustrates a conventional output circuit for a switching boost Cuk regulator that may be controlled by the controller IC containing the inverting amplifier 12 and other control circuitry shown in FIG. 7. The input voltage Vin is positive. The MOSFET switch 30 receives a switching control signal from the circuit of FIG. 7, causing the windings W1 and W2 of a transformer to be charged and discharged (through diode D1) to supply current to the load 32 at a target negative output voltage. The polarities of the windings W1 and W2 are reversed, as shown by the phase dots, so the output voltage is negative. The capacitor C1 smooths the voltage ripple. Since the divided feedback voltage is negative, the inverting amplifier 12 (FIGS. 3 and 7) is used to convert the negative feedback voltage to a positive feedback voltage so it can be processed by downstream circuitry that only operates with positive voltages.

In another type of conventional output circuit configuration, the output voltage is positive. Accordingly, the feedback voltage VFB into the controller IC will also be a positive voltage. Since the inverting amplifier 12 is only used to invert negative feedback voltages, its output in the controller IC is ignored and only the original positive feedback voltage VFB is used to regulate the output voltage. Thus, the same controller IC can be used with voltage regulators that generate positive and negative voltages.

Figure 6:
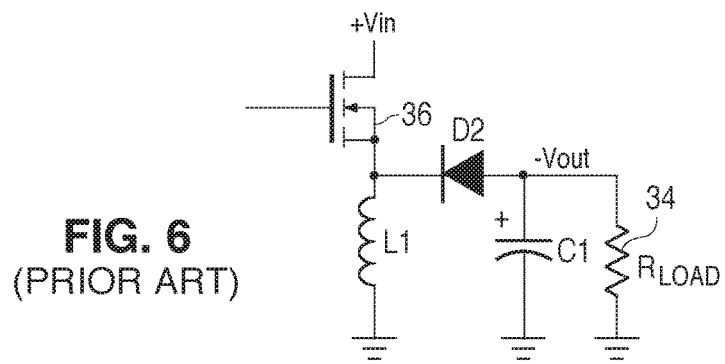
FIG. 6 illustrates a conventional output circuit for another type of positive-to-negative voltage regulator that may be used with the controller IC.

FIG. 6 illustrates another output circuit that may be used with the same controller IC, where the output circuit receives a positive input voltage Vin and outputs a regulated negative output voltage Vout to the load 34. The MOSFET switch 36 receives a switching control signal from the circuit of FIG. 7, causing the inductor L1 to be alternately charged and discharged (through diode D2) to supply current to the load 34 at a target negative output voltage. The capacitor C1 smooths the voltage ripple. Since the divided feedback voltage is negative, the inverting amplifier 12 (FIGS. 3 and 7) is used to convert the negative feedback voltage to a positive feedback voltage so it can be processed by downstream circuitry that only operates with positive voltages.

The voltage regulators may use voltage mode, current mode, hysteretic, constant on-time, or any other type of control scheme. The power conversion topology may be buck, boost, buck-boost, SEPIC, Cuk, flyback, forward, or any other type of power conversion topology that uses a feedback voltage to regulate its output.

FIG. 7 illustrates basic components of a voltage regulator controller IC 38 that uses the novel inverting amplifier 12, a novel error amplifier 40, and a novel power good monitor 42. The output voltage Vout from the output circuit, such as the output circuit of FIG. 5 or 6, is applied to a voltage divider 44, whose resistor values are selected by the user such that, when the output voltage Vout is at a target value, the divided voltage is equal to a fixed reference voltage Vref in the controller IC 38, such as 1 volt. Assuming the feedback voltage VFB is negative, the inverting amplifier 12 generates the inverted positive feedback voltage VFB_INV for application to an input of an error amplifier 40 (a transconductance amplifier). The error amplifier 40 amplifies the difference between the VFB_INV and the reference voltage Vref. A capacitor 46 connected to the output of the error amplifier 40 gets charged or discharged by the output current of the error amplifier 40 to create a control voltage Vc. An RC network may instead be used for impedance. The control voltage Vc is compared by a comparator 48 to a ramping voltage and, when the ramping voltage crosses the control voltage Vc, the comparator 48 turns off the switch (e.g., switch 30 or 36 in FIG. 5 or 6). The switch is then turned back on by a clock signal, and the cycle repeats. The ramping voltage may be a predetermined signal, such as in a voltage mode regulator, or may correspond to the instantaneous current through the inductor, such as in a current mode regulator.

The controller IC 38 may also include a power good monitor 42 that detects when the feedback voltage VFB or VFB_INV is sufficiently close to the positive reference voltage Vref to declare that the output voltage Vout is substantially at its target value. The issued power good signal may then be used to start normal operation of the load or other circuits.

Figure 8:
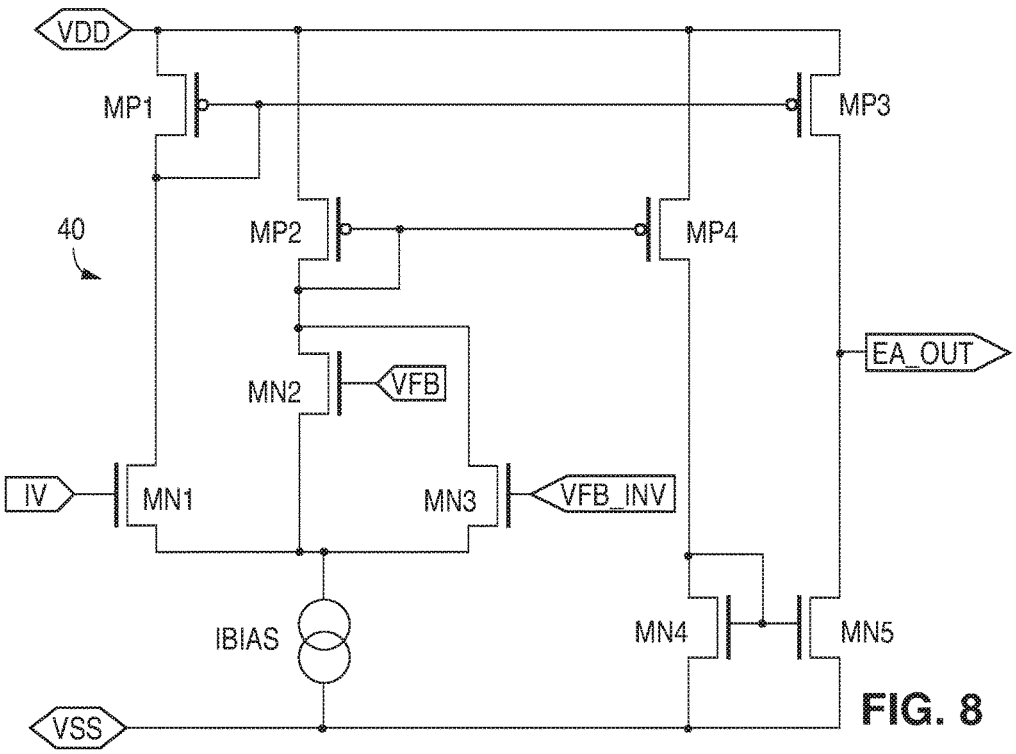
FIG. 8 illustrates a novel error amplifier that may be used in the voltage regulator of FIG. 7.

Since the feedback voltage VFB can be positive or negative, the error amplifier 40 must be able to use either VFB or VFB_INV, whichever is the positive feedback voltage, and ignore the other one. FIG. 8 illustrates an embodiment of a novel error amplifier 40 that receives both VFB and VFB_INV. In the example, the reference voltage is 1 volt applied to the MOSFET MN1. VFB and VFB_INV are applied to respective n-channel MOSFETs MN2 and MN3 connected in parallel. Only one of the MOSFETs MN2 or MN3 will be turned on since they are only turned on with a positive gate voltage. Therefore, it does not matter if the voltage regulator generates a positive or negative output voltage. A bias current IBIAS is applied to the common sources of the MOSFETs MN1, MN2, and MN3. Any current imbalance in the legs caused by the positive one of VFB or VFB_INV not being equal to 1 volt, is reflected by the gate voltages of the p-channel MOSFETs MP1 and MP2. The gate voltages control the p-channel MOSFETs MP3 and MP4, which conduct respective currents through the MOSFETs MN5 and MN4. As an example, if the positive one of the feedback voltages VFB or VFB_INV is less than the 1 volt reference voltage, the gate voltage of the MOSFET MP1 will be lower than the gate voltage of the MOSFET MP2. This causes the MOSFET MP3 (connected as a current mirror) to conduct a current that is higher than the current conducted by the MOSFET MP4 (connected as a current mirror). The MOSFETs MN5 and MN4 are connected to conduct equal currents. Since the MOSFET MP3 is conducting a greater current, the excess current is output at the EA OUT pin of the error amplifier 40 and charges the capacitor 46 in FIG. 7 to raise the control voltage Vc. This increases the duty cycle of the switch to raise the feedback voltage to match the 1 volt reference voltage.

Any conventional error amplifier may be adapted to receive the original feedback voltage VFB and the inverted feedback voltage VFB_INV by connecting the two feedback voltages to respective n-channel MOSFETs in parallel in the differential amplifier, since only one of the MOSFETs will be turned on by the positive one of VFB or VFB_INV.

Figure 9:
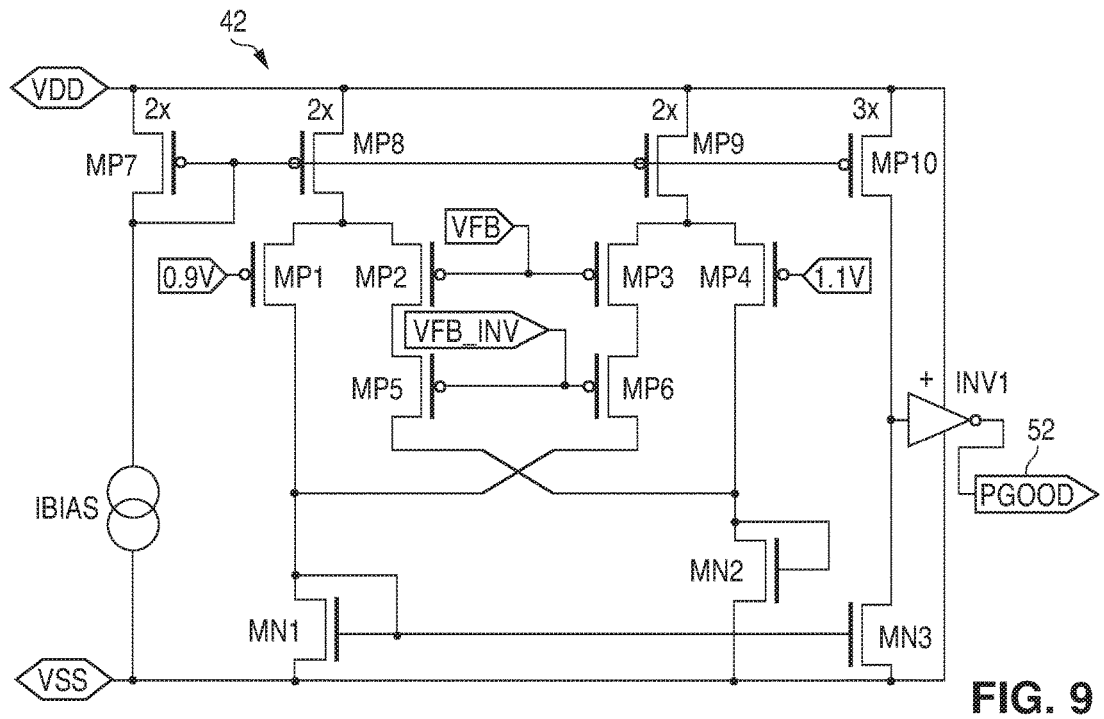
FIG. 9 illustrates a novel power good monitor that may be used in the voltage regulator of FIG. 7.

An embodiment of the power good monitor 42 of FIG. 7 is shown in FIG. 9. In the example, the power good monitor 42 determines whether either VFB or VFB_INV is a positive voltage between 0.9 and 1.1 volts, where the target feedback voltage is 1 volt. If the feedback voltage is within that range, the power good monitor 42 issues a high output signal at the output pin 52 for indicating to other circuits that the regulated voltage has been achieved. As an example, if VFB is at −1 volt and VFB_INV is at +1 volt, the output voltage is at its target voltage. Any very low or negative feedback voltage applied to the p-channel MOSFETs MP2, MP3, MP5, or MP6 will cause the MOSFET to enter its triode region (become ohmic); however, the other p-channel MOSFET in series will be modulated by the inverse feedback voltage which will be more positive, such as +1 volt. The p-channel MOSFET coupled to the more positive feedback voltage will thus control the current through the associated leg of the two, cross-coupled differential amplifiers, and that positive feedback voltage is effectively compared to the 0.9 volt and 1.1 volt thresholds. If the more positive feedback voltage is +1 volt, the current through the MOSFET MP1 will be high and the current through the MOSFET MP4 will be low. As a result, the current through the MOSFET MN1 will be high, which causes the gate voltage of the MOSFET MN1 to be high and, as a result, the MOSFET MN3, connected as a current mirror, will conduct a high current also. The current conducted by the current source MOSFET MP10 will be less than the current conducted by the MOSFET MN3, causing the input of the inverter INV1 to be pulled low. The inverted output of the inverter INV1 is thus high, representing that the power is good. If the positive one of the feedback voltages VFB or VFB_INV is outside the range of 0.9-1.1 volt, the opposite situation happens, and the inverter INV1 outputs a low voltage.

Although the various example circuits have been shown using MOSFETs, the MOSFETs may be replaced with bipolar transistors, JFETs, or other types of transistors. For a bipolar transistor implementation, the high impedance input terminals would be the bases of the bipolar transistors rather than the MOSFET gates.

Accordingly, a novel inverting amplifier, a novel error amplifier, and a novel power good circuit have been disclosed for use in a controller IC that can be used to regulate both positive and negative output voltages, depending on the output circuit required by the user.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A circuit comprising:
   an inverting amplifier for receiving a negative input voltage of a first magnitude and generating a positive output voltage of the same first magnitude, the inverting amplifier comprising:
   a high impedance input terminal of a first transistor receiving the negative input voltage;
   a first differential amplifier coupled to the first transistor; and
   a first resistor coupled to a reference voltage,
   an output of the first differential amplifier controlling current through the first resistor, wherein a voltage drop across the first resistor is the positive output voltage of the same first magnitude as the negative input voltage.

2. The circuit of claim 1 wherein the inverting amplifier further comprises:
   the first transistor also having a first transistor first terminal coupled to the reference voltage and having a first transistor second terminal;
   a second resistor having a second resistor first terminal coupled to the first transistor second terminal and having a second resistor second terminal coupled to a first input of the first differential amplifier;
   an output of the first differential amplifier being coupled to a high impedance input terminal of a second transistor, the second transistor having a second transistor first terminal coupled to the second resistor second terminal;
   the output of the first differential amplifier also being coupled to a high impedance input terminal of a third transistor, the third transistor having a third transistor first terminal coupled to a second input of the first differential amplifier;
   the second input of the first differential amplifier also being coupled to a fourth transistor first terminal, a high impedance input terminal of the fourth transistor being coupled to the reference voltage; and
   a fourth transistor second terminal being coupled to a first resistor first terminal, the first resistor having a first resistor second terminal coupled to the reference voltage,
   wherein the first resistor first terminal provides the positive output voltage, which has the same first magnitude as the negative input voltage but is of opposite polarity.

3. The circuit of claim 2 wherein the first through fourth transistors are MOSFETs, and the high impedance input terminals are gates of the MOSFETs.

4. The circuit of claim 1 further comprising:
   a first start up current source coupled to the second resistor second terminal; and
   a second start up current source coupled to the fourth transistor first terminal.

5. The circuit of claim 1 wherein the negative input voltage is a negative feedback voltage of a first voltage regulator, and the positive output voltage is a positive feedback voltage used by the first voltage regulator to regulate a negative output voltage of the first voltage regulator.

6. The circuit of claim 5 wherein the first voltage regulator receives a positive input voltage and outputs the negative regulated voltage.

7. The circuit of claim 6 wherein the negative feedback voltage is a divided negative output voltage of the first voltage regulator.

8. The circuit of claim 5 further comprising an error amplifier coupled to receive the negative feedback voltage and the positive feedback voltage, the error amplifier comprising:
   a second differential amplifier having a first leg receiving a reference voltage at a high impedance input terminal of a fifth transistor;
   the second differential amplifier having a second leg comprising a sixth transistor and a seventh transistor connected in parallel, wherein the negative feedback voltage is coupled to a high impedance input terminal of the sixth transistor, and the positive feedback voltage is coupled to a high impedance input terminal of the seventh transistor, wherein an output of the error amplifier corresponds to a difference between the reference voltage and the positive feedback voltage.

9. The circuit of claim 8 wherein the inverting amplifier and the error amplifier are configured to be used in either the first voltage regulator that outputs the negative regulated voltage or in a second voltage regulator that outputs a positive regulated voltage.

10. The circuit of claim 8 further comprising a comparator coupled to the output of the error amplifier for comparing a control voltage at the output of the error amplifier with a ramping signal to determine when to turn off a switch.

11. The circuit of claim 7 wherein the first through seventh transistors are MOSFETs, and the high impedance input terminals are gates of the MOSFETs.

12. The circuit of claim 5 further comprising a power good monitor that receives the negative feedback voltage and the positive output voltage and determines whether either of the negative feedback voltage and the positive output voltage is within a predetermined range of the reference voltage.

13. The circuit of claim 5 wherein the voltage regulator and inverting amplifier are powered by only a positive voltage power supply.

* * * * *